(12) United States Patent
Mann et al.

(10) Patent No.: US 7,989,922 B2
(45) Date of Patent: Aug. 2, 2011

(54) HIGHLY TUNABLE METAL-ON-SEMICONDUCTOR TRENCH VARACTOR

(75) Inventors: Randy W. Mann, Burlington, NC (US); Jae-Eun Park, Wappingers Falls, NY (US); Richard A. Wachnik, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 12/028,145

(22) Filed: Feb. 8, 2008

(65) Prior Publication Data
US 2009/0200642 A1 Aug. 13, 2009

(51) Int. Cl.
*H01L 29/93* (2006.01)
(52) U.S. Cl. ........ 257/599; 257/312; 257/532; 257/595; 257/E29.344
(58) Field of Classification Search .................. 257/599, 257/595, 312, E29.344, 532
See application file for complete search history.

(56) References Cited

U.S. PATENT DOCUMENTS

| | | | | |
|---|---|---|---|---|
| 3,962,713 A * | 6/1976 | Kendall et al. | ................. | 257/599 |
| 4,694,561 A * | 9/1987 | Lebowitz et al. | ............. | 438/249 |
| 6,661,069 B1 * | 12/2003 | Chinthakindi et al. | ........ | 257/415 |
| 7,129,801 B2 | 10/2006 | Wu | | |
| 2003/0183866 A1 * | 10/2003 | Sanchez et al. | ................ | 257/312 |
| 2006/0094184 A1 * | 5/2006 | Katsumata | ..................... | 438/243 |
| 2006/0273426 A1 * | 12/2006 | Iijima | ............................ | 257/532 |
| 2008/0157159 A1 * | 7/2008 | Hook et al. | .................... | 257/312 |

* cited by examiner

*Primary Examiner* — Lynne A Gurley
*Assistant Examiner* — Naima J Kearney
(74) *Attorney, Agent, or Firm* — Scully, Scott, Murphy & Presser, P.C.; Joseph P. Abate, Esq.

(57) ABSTRACT

An array of deep trenches is formed in a doped portion of the semiconductor substrate, which forms a lower electrode. A dielectric layer is formed on the sidewalls of the array of deep trenches. The array of deep trenches is filled with a doped semiconductor material to form an upper electrode comprising a top plate portion and a plurality of extension portions into the array of trenches. In a depletion mode, the bias condition across the dielectric layer depletes majority carriers within the top electrode, thus providing a low capacitance. In an accumulation mode, the bias condition attracts majority carriers toward the dielectric layer, providing a high capacitance. Thus, the trench metal-oxide-semiconductor (MOS) varactor provides a variable capacitance depending on the polarity of the bias.

14 Claims, 5 Drawing Sheets

HIGHLY TUNABLE METAL-ON-SEMICONDUCTOR TRENCH VARACTOR

RELATED APPLICATIONS

The present application is related to a co-pending U.S. patent application Ser. No. 11/617,322 filed on Dec. 28, 2006, which is incorporated herein by reference.

FIELD OF THE INVENTION

The present invention relates to a semiconductor structure, and particularly to metal-on-semiconductor (MOS) trench varactor with a highly tunable ($C_{max}/C_{min}$).

BACKGROUND OF THE INVENTION

A varactor is a semiconductor device having a voltage-sensitive capacitance. Frequently, the space-charge region and the accumulation at the surface of a semiconductor contacting an insulator are altered as a function of applied voltage to produce a bias-dependent capacitance.

Varactors are used in semiconductor applications, for example, to construct voltage-controlled oscillators (VCO). Use of a VCO is a cost-effective method for generating a tunable stable frequency without employing a circuit with multiple oscillators. U.S. Pat. No. 7,129,801 to Wu shows an exemplary use of a varactor in a VCO circuit. A VCO is a versatile basic building block for constructing transceiver circuitry, phase locked loop (PLL) circuitry, and other wireless communication circuitry.

The tuning characteristic of a varactor can affect their circuit performance significantly. The Q factor of a VCO circuit depends on the ratio of the maximum capacitance to the minimum capacitance, that is, $C_{max}/C_{min}$. While the use of a modified trench capacitor, which is commonly used in dynamic random access memory (DRAM) devices as a varactor is known in the prior art, the ratio of a maximum capacitance to a minimum capacitance is relatively low for this type of varactors with a poor processing control to obtain intended tuning ratio.

High tunability of a VCO circuit requires a high Q factor, and consequently a high number for $C_{max}/C_{min}$. The varactor disclosed in U.S. patent application Ser. No. 11/617,322 supra requires formation of pillar structures, which necessitate additional processing steps in a semiconductor manufacturing sequence.

Therefore, there exists a need for a semiconductor varactor that provides a high number for the ratio of a maximum capacitance to a minimum capacitance with minimal number of additional processing steps in a standard semiconductor manufacturing sequence.

Furthermore, requirements for the value of $C_{max}/C_{min}$ depend on the nature of the semiconductor circuit. Therefore, there exists a need for the capability of altering the value of $C_{max}/C_{min}$ by adjusting process parameters, design parameters, or alterations in the semiconductor varactor structure.

SUMMARY OF THE INVENTION

The present invention addresses the needs described above by providing a metal-on-semiconductor (MOS) trench varactor with a high value of $C_{max}/C_{min}$ (tuning ratio) and controllability of the tuning ratio.

In the present invention, an array of deep trenches is formed in a doped portion of the semiconductor substrate, which forms a lower electrode. A dielectric layer is formed on the sidewalls of the array of deep trenches. The array of deep trenches is filled with a doped semiconductor material to form an upper electrode comprising a top plate portion and a plurality of extension portions into the array of trenches. In a depletion mode, the bias condition across the dielectric layer depletes majority carriers within the top electrode, thus providing a low capacitance. In an accumulation mode, the bias condition attracts majority carriers toward the dielectric layer, providing a high capacitance. Thus, the trench metal-oxide-semiconductor (MOS) varactor provides a variable capacitance depending on the polarity of the bias.

According to the present invention, a metal-oxide-semiconductor (MOS) varactor structure is provided, which comprises:

an array of trenches located in a semiconductor substrate;

a semiconductor bottom plate comprising a doped single-crystalline semiconductor material and located directly on and outside the array of trenches;

a capacitor dielectric contacting sidewall surfaces of the array of trenches; and a semiconductor top plate contacting the capacitor dielectric and comprising a doped polycrystalline or amorphous semiconductor material.

According to one embodiment, the semiconductor top plate comprise:

a top portion located over a top surface of the semiconductor substrate; and a plurality of extension portions each of which filling one of the trenches and abutting the top portion, wherein the top portion and the plurality of extension portions are of integral and unitary construction without a physically manifested interface there between.

According to another embodiment, the doped single-crystalline semiconductor material is doped single-crystalline silicon and the doped polycrystalline or amorphous semiconductor material comprises doped polysilicon, a doped polycrystalline silicon germanium alloy, doped amorphous silicon, or a doped amorphous silicon germanium alloy.

According to even another embodiment, the doped single-crystalline semiconductor material and the doped polycrystalline or amorphous semiconductor material have opposite doping types.

According to yet another embodiment, the MOS varactor structure further comprises a heavily doped semiconductor portion located in the semiconductor substrate, abutting the semiconductor bottom plate, and having the same type of doping as the semiconductor bottom plate.

According to still another embodiment, further comprises:

a first metal semiconductor alloy portion electrically connected to the semiconductor bottom plate; and a second metal semiconductor alloy portion abutting the semiconductor top plate.

According to still yet another embodiment, the array of trenches has a depth greater than 1 μm.

In a further embodiment, the capacitor dielectric has a uniform thickness and a uniform composition and laterally abuts the entirety of sidewalls of the array of trenches and a top surface of the semiconductor substrate.

In an even further embodiment, the semiconductor bottom plate has a dopant concentration from about $1.0 \times 10^{18}/cm^3$ to about $3.0 \times 10^{21}/cm^3$.

In a yet further embodiment, the semiconductor top plate has a dopant concentration from about $1.0 \times 10^{16}/cm^3$ to about $1.0 \times 10^{20}/cm^3$.

In a still further embodiment, the semiconductor bottom plate and the semiconductor top plate have opposite doping types, and the semiconductor bottom plate has a higher dopant concentration than the semiconductor top plate.

The MOS varactor may operate in an accumulation mode or in a depletion mode. During operation in an accumulation mode, a thin majority carrier layer is formed beneath the capacitor dielectric. During operation in the depletion mode, the inside of the array of trenches is completely depleted, i.e., devoid of free mobile charges, and the capacitance of the MOS varactor is correspondingly low.

BRIEF DESCRIPTION OF THE DRAWINGS

FIG. 1A is a cross-sectional view in the plane of A-A' in FIG. 1B. FIG. 1B is a vertical cross-sectional view in the plane of B-B' in FIGS. 1A and 1C. FIG. 1C is a top-down view.

DETAILED DESCRIPTION OF THE INVENTION

Figure 1A:
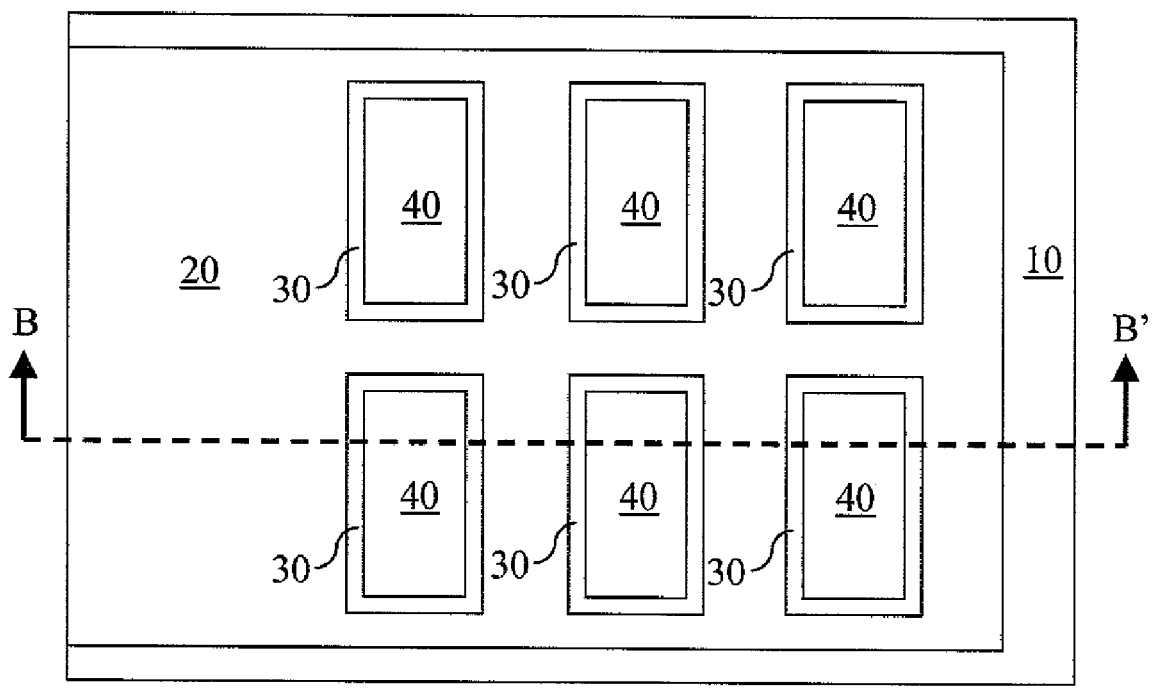
FIGS. 1A-1C are various views of a metal-on-semiconductor (MOS) varactor according to the present invention.

As stated above, the present invention relates to a semiconductor structure, and particularly to metal-on-semiconductor (MOS) trench varactor with a highly tunable ($C_{max}/C_{min}$), which will now be described in greater detail by referring to the drawings. It is noted that like and corresponding elements are referred to by like reference numerals.

Figure 1B:
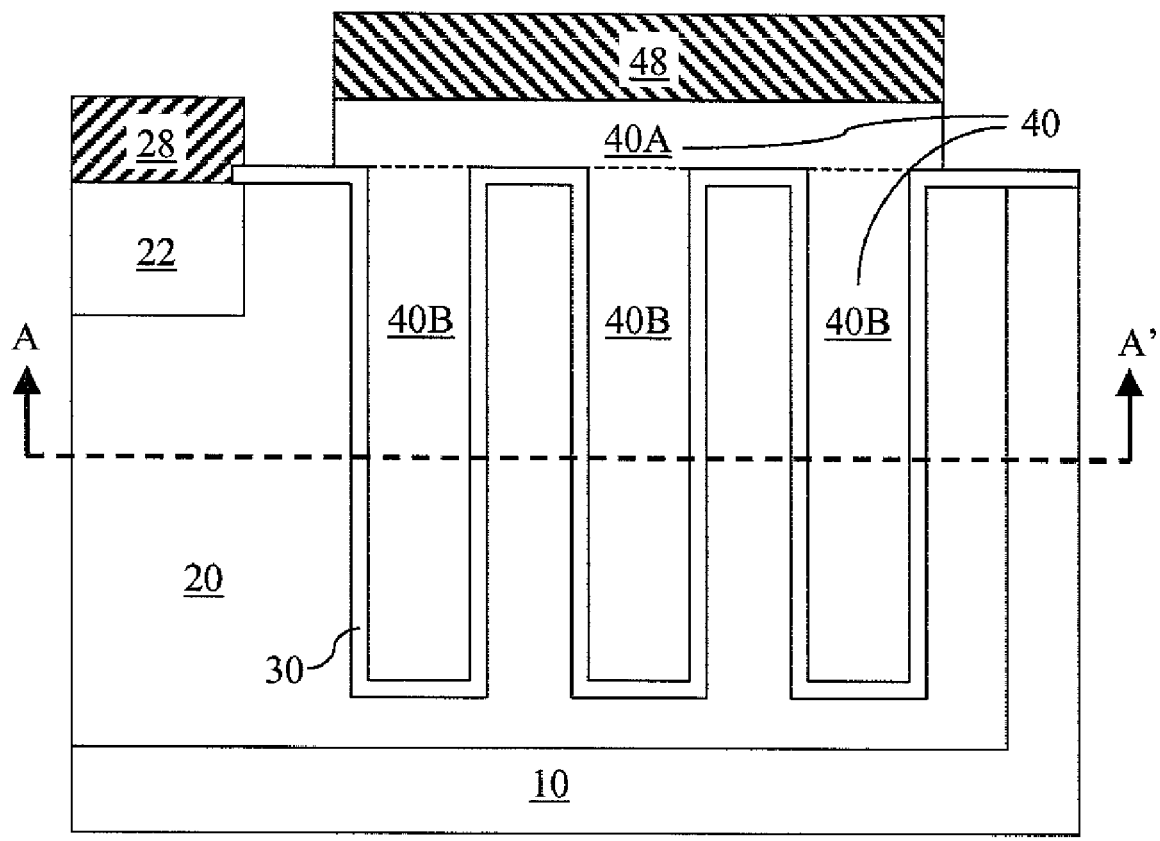
Figure 1C:
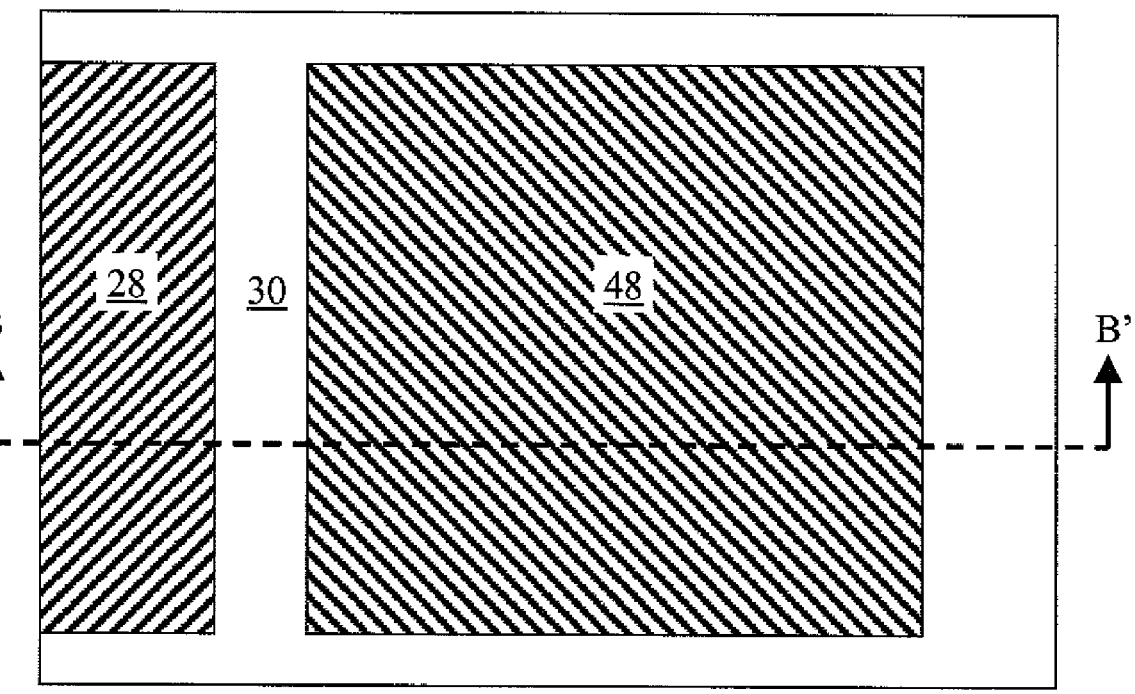

Referring to FIGS. 1A and 1B, an exemplary MOS varactor according to the present invention comprises semiconductor substrate containing substrate layer 10, a semiconductor bottom plate 20, and a heavily doped semiconductor portion 22, each of which preferably comprises a single-crystalline semiconductor material. The semiconductor substrate comprises an array of trenches, which in this example comprises a 2×3 array. In general, an array containing at least two trenches and having any geometrical arrangement may be employed. Each of the trenches may be rectangular or elliptical.

The semiconductor bottom plate 20 has a doping of a first conductivity type, which may be p-type or n-type. The dopant concentration of the semiconductor bottom plate 20 may be from about $1.0 \times 10^{18}/cm^3$ to about $3.0 \times 10^{21}/cm^3$, although lesser and greater dopant concentrations are also contemplated herein. The doping of the semiconductor bottom plate 20 may be effected by ion implantation, or alternately, by outdiffusion of dopants subsequent to formation of an array of trenches prior to formation of the capacitor dielectric 30. The heavily doped semiconductor portion 22 has a doping of the first conductivity type at a dopant concentration from about $1.0 \times 10^{20}/cm^3$ to about $3.0 \times 10^{21}/cm^3$, although lesser and greater dopant concentrations are also contemplated herein. The semiconductor substrate including the substrate layer 10, the semiconductor bottom plate 20, and the heavily doped semiconductor portion 22 comprises a semiconductor material, which may be selected from, but is not limited to, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. In a preferred embodiment, the semiconductor substrate comprises silicon.

Preferably, the trenches in the array are deep trenches, which herein denote trenches greater than the depth of shallow trench isolation structures. Typical depth for shallow trench isolation structures is from about 300 nm to about 600 nm. The deep trenches in the array may have substantially the same depth as deep trenches typically employed for deep trench capacitors (not shown), and preferably, are formed at the same processing step employing the same methods as deep trenches employed for formation of typical deep trench capacitors. Thus, the depth of the deep trenches in the array is greater than 1 mm, and is typically from about 3 μm to about 10 μm.

A capacitor dielectric 30 is formed on all exposed semiconductor surfaces including the sidewalls of the trenches in the array as well as top surfaces of the semiconductor substrate. The capacitor dielectric 30 comprises a dielectric material such as silicon nitride, silicon oxide, or a stack thereof. Not necessarily but preferably, the capacitor dielectric 30 comprises the same material as the node dielectric of deep trench capacitors, and may be formed in the same processing step as the node dielectric of the deep trench capacitors. The capacitor dielectric 30 has a uniform composition and a uniform thickness across the entirety of the sidewalls of the array of trenches.

A semiconductor top plate 40 is formed by deposition of a doped polycrystalline or amorphous semiconductor material into the trenches of the array by methods well known in the art such as formation of a layer comprising the doped polycrystalline or amorphous semiconductor material by low pressure chemical vapor deposition (LPCVD) followed by lithographic patterning of the deposited layer. Preferably, the doped polycrystalline or amorphous semiconductor material comprises doped polysilicon, a doped polycrystalline silicon germanium alloy, doped amorphous silicon, or a doped amorphous silicon germanium alloy. Doping of the doped polycrystalline or amorphous semiconductor material may be achieved by in-situ doping during deposition.

The conductive top layer 40 comprises a top portion 40A located over a top surface of the semiconductor substrate and a plurality of extension portions 40B each of which fills one of the trenches of the array. Each extension portion 40B vertically abuts the top portion 40A. Since the top portion 40A and each of the extension portions 40B are formed in the same deposition process, the top portion 40A and the plurality of the extension portions 40B are of integral and unitary construction, i.e., in one piece, and does not contain any physically manifested interface between them.

The doping type of the semiconductor top plate 40 is herein referred to as a second conductivity type, which may be p-type or n-type. The second conductivity type may be the same, or may be the opposite of, the first conductivity type. The dopant concentration of the semiconductor top plate 40 may be from about $1.0 \times 10^{16}/cm^3$ to about $1.0 \times 10^{20}/cm^3$, although lesser and greater dopant concentrations are also contemplated herein. Preferably, the semiconductor bottom plate 20 has a higher dopant concentration than the semiconductor top plate 40.

In a preferred embodiment, the semiconductor bottom plate 20 and the semiconductor top plate 40 have opposite doping types, i.e., the second conductivity type is the opposite of the first conductivity type. The different polarity of doping between the semiconductor bottom plate 20 and the semiconductor top plate 40 provides the advantage of inducing accumulation of majority charges on the outer sidewall of the trenches within the semiconductor bottom plate 20 while accumulation of majority charges occur inside of the trenches within the plurality of extension portions 40B. Further, depletion of majority charges is induced on the outer sidewall of the trenches within the semiconductor bottom plate 20 while depletion of majority charges occur inside of the trenches within the plurality of extension portions 40B.

Alternately, the semiconductor bottom plate 20 and the semiconductor top plate 40 may have the same polarity of doping.

A first metal semiconductor alloy portion 28 may be formed directly on the heavily doped semiconductor portion 22 and a second metal semiconductor alloy portion 48 may be formed directly on the semiconductor top plate 40 by methods well known in the art such as silicidation to provide electrical contact to the semiconductor bottom plate 20 and to the semiconductor top plate, respectively.

Figure 2:
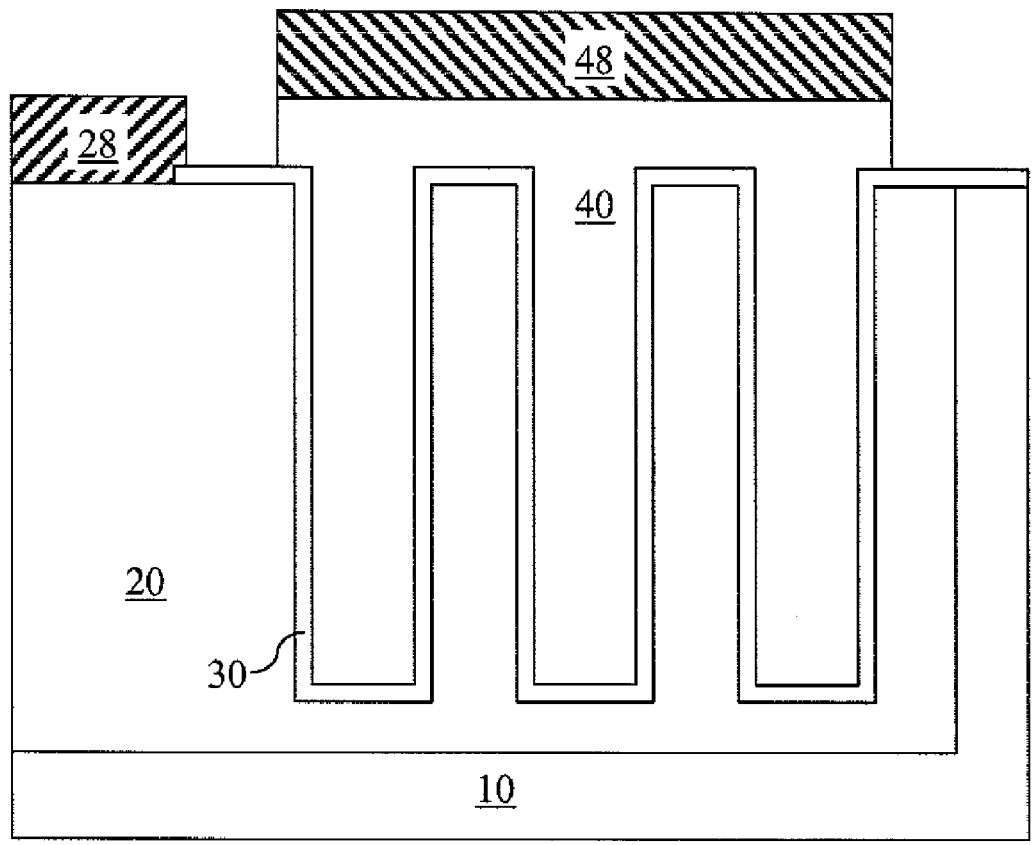
FIG. 2 is a variation on the metal-on-semiconductor (MOS) varactor according to the present invention.

Referring to FIG. 2, a variation on the exemplary MOS varactor may omit the formation of the heavily doped semiconductor portion 22, i.e., the first metal semiconductor alloy portion 28 may be formed directly on the semiconductor bottom plate 20.

Figure 3A:
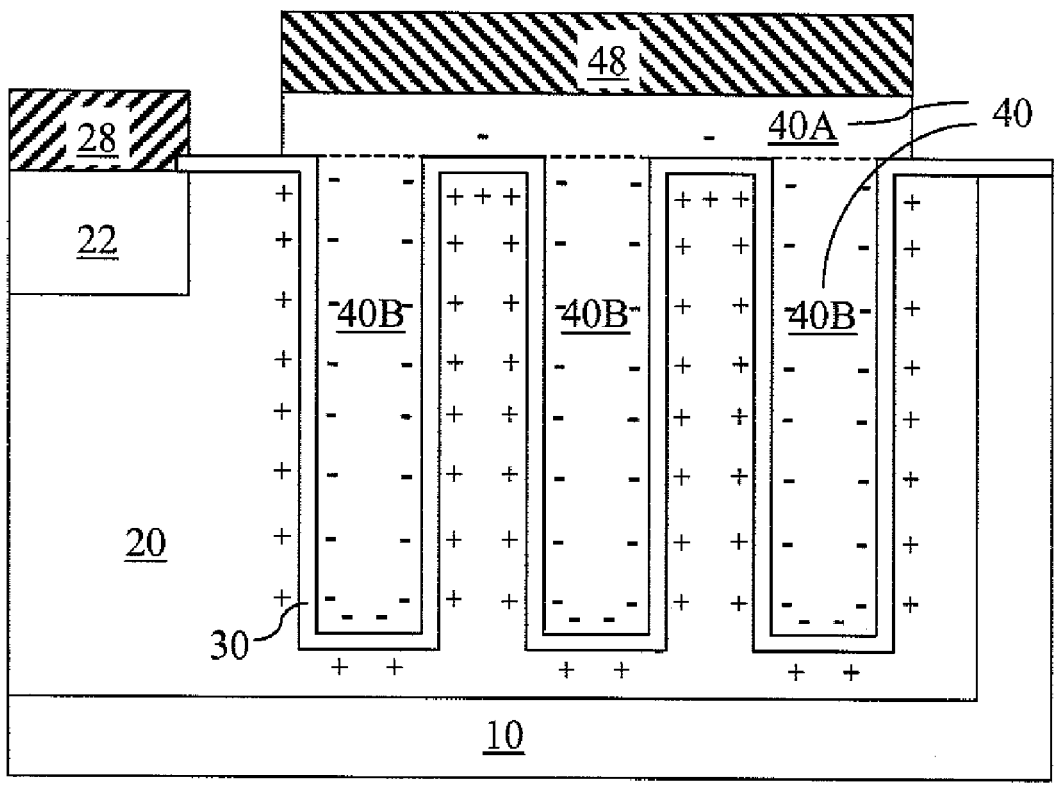
FIG. 3A is a schematic diagram showing charge accumulation in an accumulation mode in the extension portions of the semiconductor top plate having at, n-type doping.

Referring to FIG. 3A, operation of the exemplary MOS varactor in an accumulation mode is schematically illustrated for the case of a semiconductor top plate 20 having an n-type doping. A positive voltage is applied to the semiconductor bottom plate 20 relative to the semiconductor top plate 40. For example, a positive voltage is applied to the semiconductor bottom plate 20 and a negative voltage is applied to the semiconductor top plate 40. The majority carriers in the semiconductor top plate 20, which in this case are electrons, are attracted to the surface of the capacitor dielectric 30 in the plurality of extension portions 40B. The presence of the electrons on the walls of the plurality of extension portions 40B attracts holes on the outer sidewalls of the array of trenches. In case the polarity of doping is opposite between the semiconductor bottom plate 20 and the semiconductor top plate 40, availability of holes as majority carriers in the semiconductor bottom plate 20 facilitates formation of positive charges on the outer side of the array of trenches. Likewise, higher doping concentration level of the semiconductor bottom plate 20 relative to the semiconductor top plate 40 also facilitates formation of positive charges on the outer side of the array of trenches. Thus, the exemplary MOS varactor provides a high capacitance in the accumulation mode.

Figure 3B:
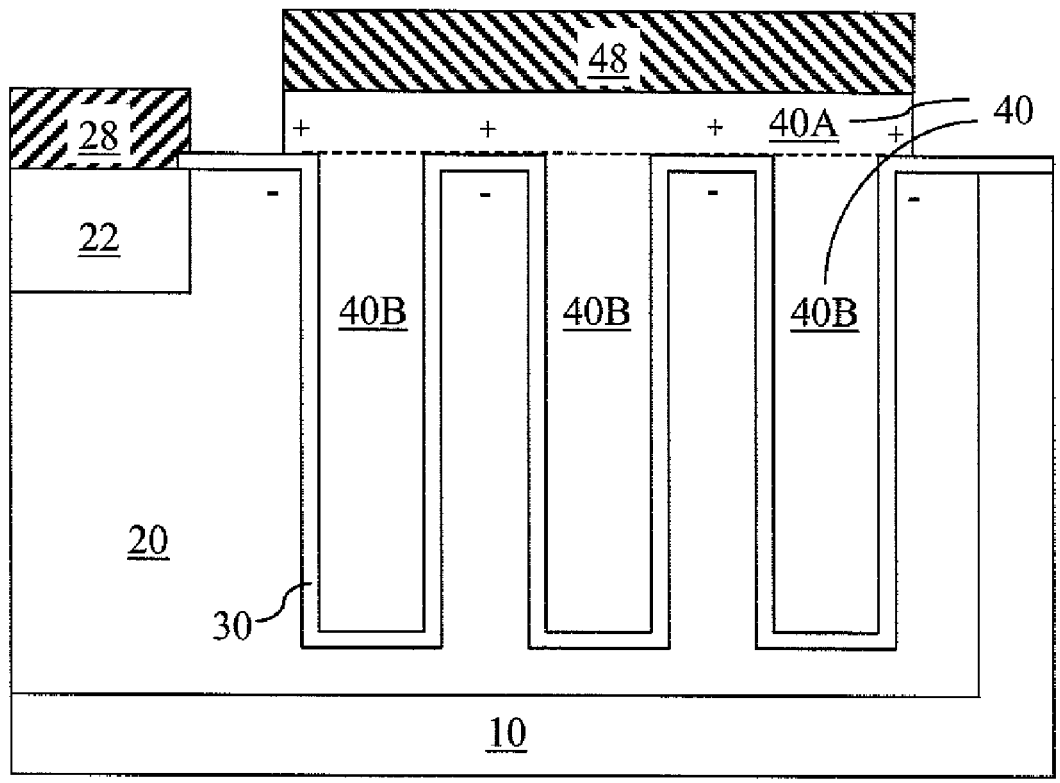
FIG. 3B is a schematic diagram showing charge depletion in a depletion mode in the extension portions of the semiconductor top plate having the n-type doping.

Referring to FIG. 3B, operation of the exemplary MOS varactor in a depletion mode is schematically illustrated for the case of the semiconductor top plate 20 having an n-type doping, i.e., for the case of the opposite type of electrical bias to the same structure employed in FIG. 3A. A negative voltage is applied to the semiconductor bottom plate 20 relative to the semiconductor top plate 40. For example, a negative voltage is applied to the semiconductor bottom plate 20 and a positive voltage is applied to the semiconductor top plate 40. The majority carriers in the semiconductor top plate 20, which in this case are electrons, are repelled out of the plurality of extension portions 40B. Thus, the plurality of extension portions 40B is depleted of majority carriers, i.e., electrons. Since few electrons are present in the plurality of extension portions 40B, few holes are attracted to the outer sidewalls of the array of trenches. Such lack of charges around the sidewalls of the array of trenches occurs irrespective of the polarity of doping or doping concentration of the semiconductor bottom plate 20 and the semiconductor top plate 40. Thus, the exemplary MOS varactor provides a low capacitance in the depletion mode.

Figure 4A:
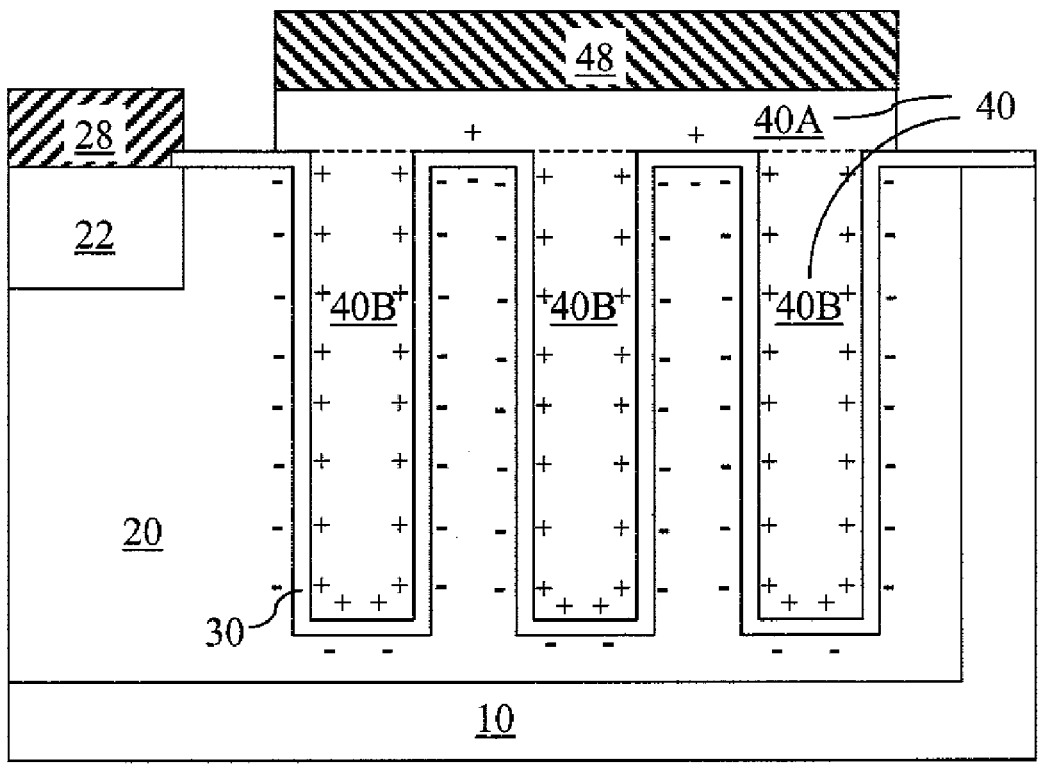
FIG. 4A is a schematic diagram showing charge accumulation in an accumulation mode in the extension portions of the semiconductor top plate having a p-type doping.

Referring to FIG. 4A, operation of the exemplary MOS varactor in an accumulation mode is schematically illustrated for the case of a semiconductor top plate 20 having a p-type doping. A negative voltage is applied to the semiconductor bottom plate 20 relative to the semiconductor top plate 40. For example, a negative voltage is applied to the semiconductor bottom plate 20 and a positive voltage is applied to the semiconductor top plate 40. The majority carriers in the semiconductor top plate 20, which in this case are holes, are attracted to the surface of the capacitor dielectric 30 in the plurality of extension portions 40B. The presence of the holes on the walls of the plurality of extension portions 40B attracts electrons on the outer sidewalls of the array of trenches. In case the polarity of doping is opposite between the semiconductor bottom plate 20 and the semiconductor top plate 40, availability of electrons as majority carriers in the semiconductor bottom plate 20 facilitates formation of positive charges on the outer side of the array of trenches. Likewise, higher doping concentration level of the semiconductor bottom plate 20 relative to the semiconductor top plate 40 also facilitates formation of positive charges on the outer side of the array of trenches. Thus, the exemplary MOS varactor provides a high capacitance in the accumulation mode.

Figure 4B:
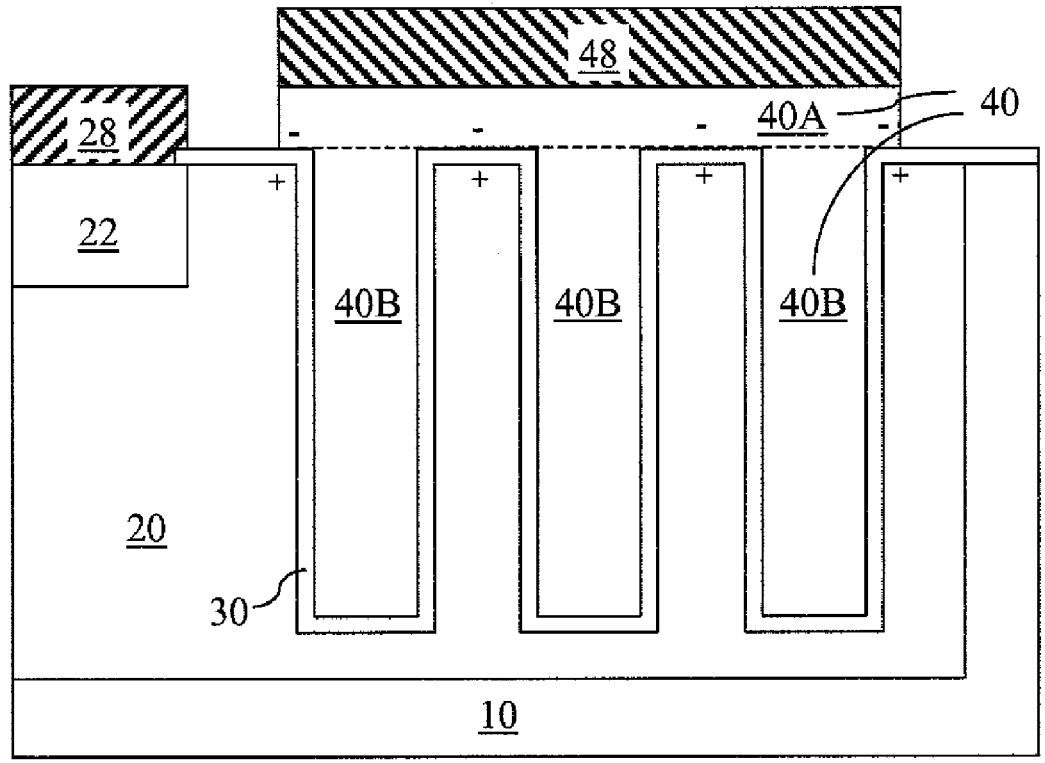
FIG. 4B is a schematic diagram showing charge depletion in a depletion mode in the extension portions of the semiconductor top plate having the p-type doping.

Referring to FIG. 4B, operation of the exemplary MOS varactor in a depletion mode is schematically illustrated for the case of the semiconductor top plate 20 having a p-type doping, i.e., for the case of the opposite type of electrical bias to the same structure employed in FIG. 4A. A positive voltage is applied to the semiconductor bottom plate 20 relative to the semiconductor top plate 40. For example, a positive voltage is applied to the semiconductor bottom plate 20 and a negative voltage is applied to the semiconductor top plate 40. The majority carriers in the semiconductor top plate 20, which in this case are holes, are repelled out of the plurality of extension portions 40B. Thus, the plurality of extension portions 40B is depleted of majority carriers, i.e., holes. Since few holes are present in the plurality of extension portions 40B, few electrons are attracted to the outer sidewalls of the array of trenches. Such lack of charges around the sidewalls of the array of trenches occurs irrespective of the polarity of doping or doping concentration of the semiconductor bottom plate 20 and the semiconductor top plate 40. Thus, the exemplary MOS varactor provides a low capacitance in the depletion mode.

Figure 5:
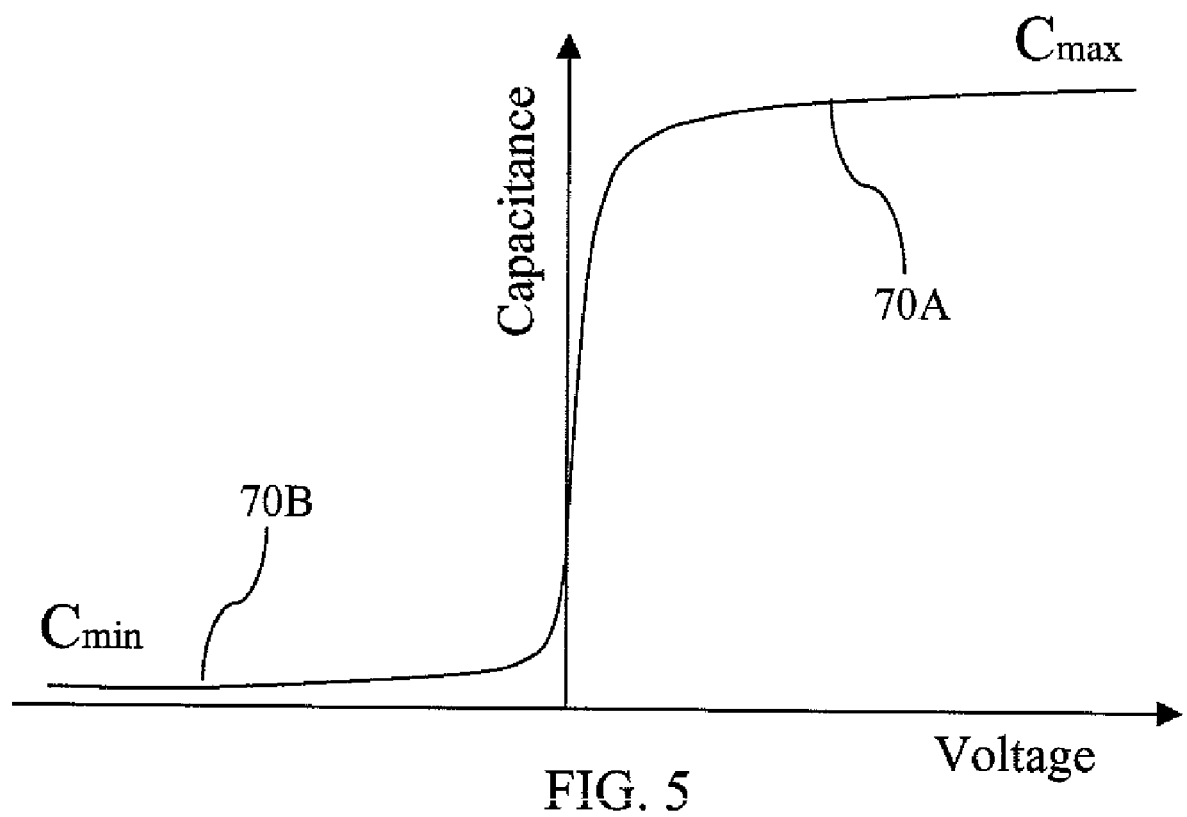
FIG. 5 is a graph of gate voltage versus capacitance showing the difference in capacitance between the accumulation mode and the depletion mode. The units are arbitrary on both axes.

The set-in of the accumulation mode requires a small voltage differential between the semiconductor top plate and the semiconductor bottom plate as can be seen in FIG. 5, which shows an accumulation mode curve 70A and a nominal depletion mode curve 70B. The capacitance curves (70A, 70B) show the variation in the capacitance of exemplary MOS varactor as a function of the voltage across the capacitor dielectric, that is, the voltage bias between the semiconductor top plate 40 relative to the semiconductor bottom plate 20.

The polarity of the voltage bias needed across the capacitor dielectric 30 to induce an accumulation mode or to induce a depletion mode depends on the doping of the semiconductor top plate 40. Also, the voltage at which a transition occurs between the accumulation mode and the depletion mode depends on the material in the semiconductor top plate 40.

The mode of the MOS varactor changes between an accumulation mode and a depletion mode with application of a modest voltage bias across the two electrodes, typically, on the order of the band gap of the semiconductor substrate, which in the case of silicon is 1.10V. In the accumulation mode, the capacitance of the MOS varactor rapidly approaches the maximum capacitance $C_{max}$ with an increase in the magnitude of the voltage bias. Also, in the depletion mode, the capacitance of the MOS varactor rapidly approaches the minimum capacitance $C_{min}$ with an increase in the magnitude of the voltage bias.

The exemplary MOS varactor provides a high $C_{max}/C_{min}$ ratio due to the changes in the capacitance between the accumulation mode and the depletion mode. The value of the $C_{max}/C_{min}$ ratio may be tuned by adjusting process parameters such as the depth of the trenches, the thickness of the capacitor dielectric 30, the polarity of doping and dopant concentration of the semiconductor bottom plate 20, and/or the polarity of doping and dopant concentration of the semiconductor top plate 40. Further, the value of the $C_{max}/C_{min}$ ratio may be tuned by adjusting design parameters such as the cross-sectional shape width of each trench within the array, and/or the spacing between adjacent trenches.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A metal-oxide-semiconductor (MOS) varactor structure configured to provide a variable capacitance by applying voltage bias of different polarities across electrodes and without physically moving any component therein, comprising:
   an array of trenches located in a semiconductor substrate;
   a semiconductor bottom plate of unitary and contiguous construction and comprising a doped single-crystalline semiconductor material located directly on and outside said array of trenches and embedded in said semiconductor substrate, wherein said semiconductor bottom plate contiguously extends laterally from each sidewall of said array of trenches to a sidewall of an adjacent trench among said array of trenches, and said semiconductor bottom plate having a doping of a first conductivity type at a first dopant concentration throughout, and wherein said semiconductor bottom plate is not directly contacting any other semiconductor material located directly on or within said array of trenches;
   a capacitor dielectric directly contacting all sidewall surfaces and all bottom surfaces of all trenches in said array of trenches and portions of a top surface of said semiconductor substrate between said array of trenches;
   a semiconductor top plate directly contacting said capacitor dielectric and comprising a doped polycrystalline or amorphous semiconductor material that completely fills said array of trenches; and
   means for applying voltage biases of different polarities across said top semiconductor top plate and said semiconductor bottom plate with different polarities, wherein said MOS varactor structure has different capacitance depending on a polarity of an applied voltage bias across said top semiconductor top plate and said semiconductor bottom plate.

2. The MOS varactor structure of claim 1, wherein said semiconductor top plate comprises:
   a top portion located over a top surface of said semiconductor substrate; and
   a plurality of extension portions each of which filling one of said trenches and abutting said top portion, wherein said top portion and said plurality of extension portions are of integral and unitary construction without a physically manifested interface there between.

3. The MOS varactor structure of claim 1, wherein said doped single-crystalline semiconductor material is doped single-crystalline silicon and said doped polycrystalline or amorphous semiconductor material comprises doped polysilicon, a doped polycrystalline silicon germanium alloy, doped amorphous silicon, or a doped amorphous silicon germanium alloy.

4. The MOS varactor structure of claim 1, wherein said doped single-crystalline semiconductor material and said doped polycrystalline or amorphous semiconductor material have opposite doping types.

5. The MOS varactor structure of claim 1, further comprising a heavily doped semiconductor portion located in said semiconductor substrate, abutting said semiconductor bottom plate, and having the same type of doping as said semiconductor bottom plate.

6. The MOS varactor structure of claim 1, further comprising:
   a first metal semiconductor alloy portion electrically connected to said semiconductor bottom plate; and
   a second metal semiconductor alloy portion abutting said semiconductor top plate.

7. The MOS varactor structure of claim 1, wherein said array of trenches has a depth greater than 1 mm.

8. The MOS varactor structure of claim 1, wherein said capacitor dielectric has a uniform thickness and a uniform composition and laterally abuts the entirety of sidewalls of said array of trenches and a top surface of said semiconductor substrate.

9. The MOS varactor structure of claim 1, wherein a top surface of a portion of said semiconductor bottom plate between a pair of trenches in said array of trenches vertically abuts said capacitor dielectric, and wherein a bottom surface of a portion of said semiconductor top plate vertically abuts said capacitor dielectric over said portion of said semiconductor bottom plate between said pair of trenches, and wherein said semiconductor top plate has a doping of a second conductivity type at a second dopant concentration throughout and said second conductivity type is the opposite of said first conductivity type.

10. The MOS varactor structure of claim 1, wherein a top surface of a portion of said semiconductor bottom plate between a pair of trenches in said array of trenches vertically abuts said capacitor dielectric, and wherein a bottom surface of a portion of said semiconductor top plate vertically abuts said capacitor dielectric over said portion of said semiconductor bottom plate between said pair of trenches, and wherein said semiconductor top plate has a doping of a second conductivity type at a second dopant concentration throughout and said second conductivity type is the same as said first conductivity type.

11. The MOS varactor structure of claim 1, wherein an entirety of said capacitor dielectric comprises a same material.

12. The MOS varactor structure of claim 1, wherein a top portion of said bottom plate between a pair of trenches among said array of trenches is spaced from a top portion of said semiconductor top plate.

13. The MOS varactor structure of claim 1, wherein said semiconductor top plate comprises a top portion located over a top surface of said semiconductor substrate and a plurality of extension portions located within said array of trenches.

14. The MOS varactor structure of claim 13, wherein said MOS varactor is geometrically configured to deplete charge carriers from said plurality of extension portions in a depletion mode upon application of electrical bias of one polarity across said capacitor dielectric, and not to deplete charge carriers from said plurality of extension portions in an accumulation mode upon application of electrical bias of an opposite polarity across said capacitor dielectric.

\* \* \* \* \*